United States Patent
Hagimoto et al.

(10) Patent No.: US 10,840,671 B2
(45) Date of Patent: *Nov. 17, 2020

(54) SEMICONDUCTOR LASER DEVICE

(71) Applicant: USHIO DENKI KABUSHIKI KAISHA, Tokyo (JP)

(72) Inventors: Masato Hagimoto, Tokyo (JP); Susumu Sorimachi, Tokyo (JP); Tomonobu Tsuchiya, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/936,113

(22) Filed: Mar. 26, 2018

(65) Prior Publication Data
US 2018/0278015 A1    Sep. 27, 2018

(30) Foreign Application Priority Data

Mar. 27, 2017  (JP) .................. 2017-061058
Aug. 29, 2017  (JP) .................. 2017-164095

(51) Int. Cl.
*H01S 5/024*    (2006.01)
*H01S 5/30*    (2006.01)
(Continued)

(52) U.S. Cl.
CPC ........ *H01S 5/02469* (2013.01); *H01S 5/0218* (2013.01); *H01S 5/02476* (2013.01);
(Continued)

(58) Field of Classification Search
CPC ................................................. H01S 5/02476
See application file for complete search history.

(56) References Cited

U.S. PATENT DOCUMENTS 8,068,524 B1 * 11/2011 Patel .................. B82Y 20/00
372/34
9,318,871 B2    4/2016 Sakata et al.
(Continued)

FOREIGN PATENT DOCUMENTS

JP    2007-081096    *  3/2007
JP    2014-225660 A    12/2014

OTHER PUBLICATIONS

"Cree announces commercial production of 100-mm Zero Micropipe SiC substrates"; LEDs magazine, Oct. 16, 2007 (Year: 2007).*

*Primary Examiner* — Tod T Van Roy
(74) *Attorney, Agent, or Firm* — Studebaker & Brackett PC

(57) ABSTRACT

Disclosed herein is a semiconductor laser device utilizing a monocrystalline SiC substrate that is capable of assuring a sufficient heat dissipation property. The semiconductor laser device comprises: a monocrystalline SiC substrate having an electrical conductivity, the substrate having a first surface and a second surface; and a semiconductor laser chip (LD chip) arranged on the first surface. Also, the semiconductor laser device may comprise an insulating film arranged at a side of the first surface of the SiC substrate and configured to insulate a first electric conductive layer onto which the semiconductor laser chip is mounted and an electric conductive member (a second electric conductive layer and a heatsink portion) to be joined to a side of the second surface of the SiC substrate.

11 Claims, 4 Drawing Sheets

(51) Int. Cl.
*H01S 5/02* (2006.01)
*H01S 5/022* (2006.01)

(52) U.S. Cl.
CPC .......... *H01S 5/3013* (2013.01); *H01S 5/0216* (2013.01); *H01S 5/02212* (2013.01); *H01S 5/02272* (2013.01); *H01S 5/02276* (2013.01)

(56) References Cited

U.S. PATENT DOCUMENTS

| | | | |
|---|---|---|---|
| 9,496,680 B2 | 11/2016 | Sakata et al. | |
| 2002/0110945 A1* | 8/2002 | Kuramata | B82Y 20/00 |
| | | | 438/36 |
| 2010/0219419 A1* | 9/2010 | Hata | B82Y 20/00 |
| | | | 257/79 |
| 2014/0321491 A1* | 10/2014 | Sakata | H01S 5/02276 |
| | | | 372/44.01 |
| 2015/0108518 A1* | 4/2015 | Samonji | H01L 33/32 |
| | | | 257/94 |
| 2016/0230309 A1* | 8/2016 | Danno | C30B 19/12 |
| 2017/0288367 A1* | 10/2017 | Taniguchi | H01S 5/02248 |

* cited by examiner

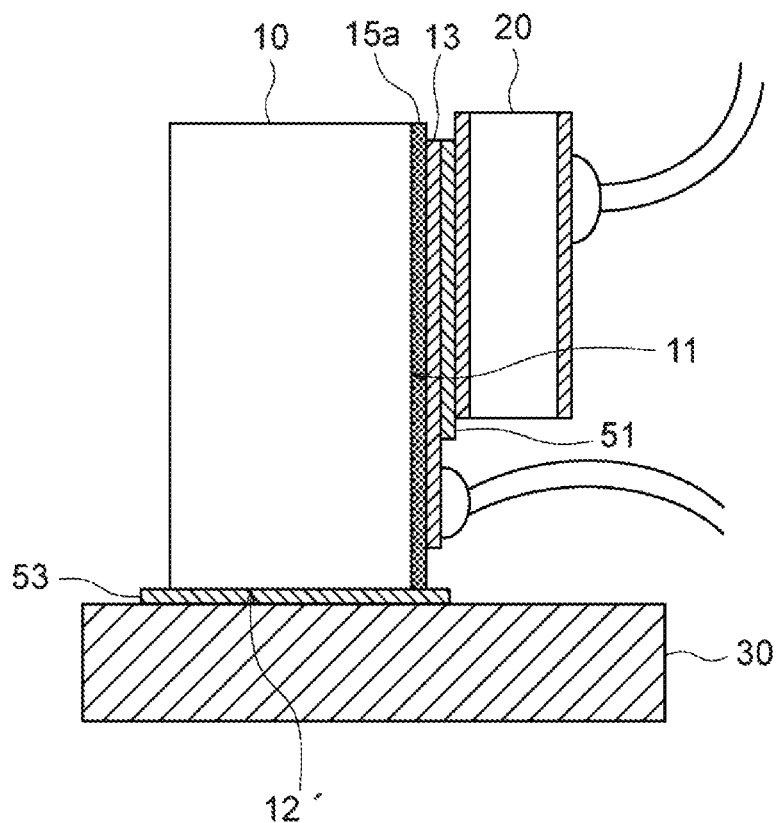

SEMICONDUCTOR LASER DEVICE

FIELD OF THE INVENTION

The present invention relates to a semiconductor laser device that employs a monocrystalline silicon carbide (SiC) as a sub-mount substrate.

DESCRIPTION OF THE RELATED ART

In general, it is considered to be desirable to employ a member having a superior heat dissipation property for a sub-mount of a semiconductor laser device. Conventionally, a certain semiconductor laser device has been known that employs a monocrystalline or single crystal silicon carbide (hereinafter referred to as "SiC") for the sub-mount as the member having the higher heat dissipation property.

For example, a Patent Literature 1 discloses a semiconductor laser device that employs an individual piece cut off from a wafer of the single ctystal SiC, which is assumed to have a better heat dissipation property, and having a defect in a hollow pipe shape, which is referred to as a "micropipe", as the sub-mount.

In this kind of semiconductor laser device, in light of the findings that, when a conductive member such as a solder material or the like creeps into the micropipe, the conductive member breaks down an insulating property of the single crystal SiC, which leads to a fault of the entire semiconductor laser device itself, the technique disclosed in the Patent Literature 1 fills the micropipes with an insulating material so as to intend to prevent the insulating property from being lowered.

LISTING OF REFERENCES

Patent Literatures

Patent Literature 1: Japanese Patent Application Laid-open Publication No. 2014-225660 A

SUMMARY OF THE INVENTION

Problems to be Solved by the Invention

However, in the technique disclosed in the Patent Literature 1, in the case in which the monocrystalline or single crystal SiC as the sub-mount is provided with an electric conductive component (for example, a base portion) on one surface thereof and another electric conductive component (for example, a semiconductor laser element) on the other surface thereof, it employs a monocrystalline SiC of an insulating property having a resistance to the extent to prevent the leakage of those components. More particularly, it employs the monocrystalline SiC having a specific resistance equal to or greater than $1*10^7$ Ω·cm.

However, the monocrystalline SiC substrate having the insulating property contains a large number of micropipes inside the substrate. For this reason, it entails a complicated process for filling a large number of micropipes with the insulating material. In addition, a large number of micropipes existing inside the substrate may lead to an adverse factor that impedes the thermal conduction of the substrate.

The present invention has been made in view of the above described circumstances and an object thereof is to provide a semiconductor laser device utilizing a monocrystalline or single crystal silicon carbide (SiC) substrate that is capable of assuring a sufficient heat dissipation property.

Solution to the Problem

In order to solve the above described problems, according to one aspect of the present embodiments of the present invention, there is provided a semiconductor laser device. The semiconductor laser device comprises: a monocrystalline silicon carbide (SiC) substrate having an electrical conductivity, the substrate being provided with a first surface and a second surface; and a semiconductor laser chip arranged on the first surface.

By employing the above configured semiconductor laser device, a monocrystalline SiC substrate having an electrical conductivity is employed as a sub-mount substrate constituting a sub-mount to which a semiconductor laser chip is joined.

Hereinafter throughout the specification, out of monocrystalline SiC substrates, a monocrystalline SiC substrate containing impurities equal to or greater than $1*10^{14}/cm^3$ can be defined to be a monocrystalline SiC substrate that is "electric conductive" or "having an electrical conductivity".

The inventors of the present invention have newly found out that a monocrystalline SiC substrate having an electrical conductivity contains less micropipes than a monocrystalline SiC substrate having an insulating property. For this reason, the monocrystalline SiC substrate having the electrical conductivity can be assumed to be superior to the monocrystalline SiC substrate having the insulating property from the perspective of the thermal conductivity, in other words, the heat dissipation property.

According to another aspect of the present embodiment, the above described semiconductor laser device may be provided with a first electric conductive layer on which the semiconductor laser chip is arranged and being provided at a side of the first surface of the SiC substrate and an insulating film insulating the first electric conducive layer from an electric conductive member to be joined to a side of the second surface of the SiC substrate.

By employing the above configured semiconductor laser device, there is provided an insulating film that insulates the first electric conductive layer arranged at the side of the first surface of the SiC substrate from the electric conducive member to be joined to the side of the second surface of the SiC substrate. Thus, it makes it possible to prevent the leakage of the electric conductive member arranged at the first surface side of the SiC substrate (that is, the semiconductor laser chip) and another electric conductive member arranged at the second surface side of the SiC substrate (for example, a base portion such as a heatsink or the like). In addition, unlike the conventional semiconductor laser device, it allows to eliminate a process to seal or close the micropipes with the insulating material. Thus, it makes it possible to simplify a process for fabricating the sub-mount substrate.

According to yet another aspect of the present embodiment, the semiconductor laser device may be provided with a second electric conductive layer arranged at a side of the second surface of the SiC substrate, and the insulating film may insulate the first electric conductive layer from the second electric conductive layer. In this case, when, for example, the first surface and the second surface of the SiC substrate are provided with electrodes as electric conductive layers, respectively, it makes it possible to prevent the short-circuit between the electrodes thereof.

According to yet another aspect of the present embodiment, in the above described semiconductor laser device, a joining or junction layer configured to join the electric conductive member to the second surface may be formed at the side of the second surface of the SiC substrate. In this case, when the SiC substrate and the electric conductive member are joined to each other by the joining layer, it makes it possible to prevent, by the insulating film, the short circuit, which may occur with a solder material or the like constituting the joining layer creeping to a side face of the SiC substrate.

According to yet another aspect of the present embodiment, in the above described semiconductor laser device, the insulating film may be arranged on the first surface. With the insulating film being so configured, the insulating film may be arranged on a surface at a side of the semiconductor laser device. In this case, when, for example, the SiC substrate and the electric conductive member are joined to each other by the solder material, it makes it possible to assure the insulation between the first electric conductive layer and the electric conductive member even when the solder material creeps to the side face of the SiC substrate.

According to yet another aspect of the present embodiment, in the above described semiconductor laser device, the insulating film may be arranged on the second surface. With the insulating film being so configured, the insulating film may be arranged on a surface different from a surface at the semiconductor laser device side. Since the insulating film has the lower thermal conductivity as compared to the SiC substrate, it makes it possible to further improve the heat dissipation property by arranging the insulating film at a position distant from the semiconductor laser chip serving as a heat radiating or generating portion, for example, on the second surface to which, for example, the heatsink portion is to be joined.

According to yet another aspect of the present embodiment, in the above described semiconductor laser device, the insulating film may have a linear expansion coefficient between a linear expansion coefficient of the SiC substrate and a linear expansion coefficient of a semiconductor layer constituting the semiconductor laser chip. With the insulating film being so configured, it makes it possible to suppress the insulting film from exfoliating or the like in an appropriate manner.

According to yet another aspect of the present embodiment, in the above described semiconductor laser device, the insulating film may have a film thickness equal to or greater than 0.2 µm and equal to or less than 10 µm. With the insulating film being so configured, it makes it possible to obtain the film thickness within an appropriate range while balancing both the insulating property being assured and the film forming limit of the insulating film.

According to yet another aspect of the present embodiment, in the above described semiconductor laser device, the insulating film may have the film thickness equal to or less than 4 µm. With the insulating film being so configured, it makes it possible to reduce the time required for forming the insulating film. Also, it makes it possible to suppress the heat dissipation, which is associated with forming the insulating film 15a, from being reduced to the minimum.

According to yet another aspect of the present embodiment, in the above described semiconductor laser device, a semiconductor layer constituting the semiconductor laser chip may include a substrate made of any of a GaAs-based material, an InP-based material, and GaN-based material. Also, the insulating film may be made of one or more materials selected from a group consisting of aluminum nitride, silicon nitride, silicon oxide, aluminum oxide, aluminum oxynitride, titanium oxide, and silicon oxynitride. With the semiconductor laser device being so configured, it makes it possible to allow the insulating film to have a linear expansion coefficient between a linear expansion coefficient of the SiC substrate and a linear expansion coefficient of the semiconductor layer constituting the semiconductor laser chip.

According to yet another aspect of the present embodiment, in the above described semiconductor laser device, the insulating film may be any one of a monocrystalline aluminum nitride film and a polycrystalline aluminum nitride film. In this way, with the aluminum nitride film being in a crystalline state instead of an amorphous or non-crystalline state, it makes it possible to attain a higher heat transfer property.

According to yet another aspect of the present embodiment, in the above described semiconductor laser device, the SiC substrate may have a crystalline structure that includes a first crystalline plane, which has a normal line direction thereof on a first crystalline axis, and a second crystalline plane, which has a normal line direction thereof on a second crystalline axis having a higher thermal conductivity than the first crystalline axis. The first crystalline plane may incline with respect to the first surface of the SiC substrate.

In this way, by configuring the SiC substrate such that a thickness direction of the SiC substrate inclines with respect to the crystalline axes uniformly, it makes it possible to increase the thermal conductivity in the thickness direction of the SiC substrate. As a result, in the case in which, for example, the semiconductor laser chip, which serves as a heat radiating or generating portion, and the heatsink portion, which serves as a heat exhaust portion, are arranged to be opposed to each other in the thickness direction of the SiC substrate, it makes it possible to dissipate heat from the heat radiating or generating portion in an effective manner.

According to yet another aspect of the present embodiment, in the above described semiconductor laser device, a rated power output of the semiconductor laser device may be equal to or greater than 1 W. In the semiconductor laser device having such a large output, higher heat dissipation property is further necessitated. For this reason, when the above described SiC substrate is employed for the sub-mount substrate, higher benefit can be obtained.

According to yet another aspect of the present embodiment, in the above described semiconductor laser device, the number of the micropipes per wafer (in a unit of wafer) of the monocrystalline SiC substrate having the electrical conductivity may be equal to or less than $30/cm^2$. In this case, it makes it possible to obtain a sub-mount substrate having no, or substantially no, micropipes after being divided for the semiconductor laser chip.

Advantageous Effect of the Invention

According to the above described aspects of the semiconductor laser device of the various embodiments, it makes it possible to obtain a semiconductor laser device utilizing a monocrystalline or single crystal SiC substrate that is capable of assuring the sufficient heat dissipation property.

These and other objects, aspects and advantages of the present invention will become apparent to those skilled in the art from the following detailed description when read and understood in conjunction with the appended claims and drawings.

BRIEF DESCRIPTION OF THE DRAWINGS

FIG. 6 is a cross sectional view illustrating an exemplary configuration of a sub-mount according to a fourth embodiment.

DETAILED DESCRIPTION OF THE INVENTION

Hereinafter, embodiments of the semiconductor laser device according to the present invention will be explained in detail with reference to accompanying drawings.

First Embodiment

Figure 1:
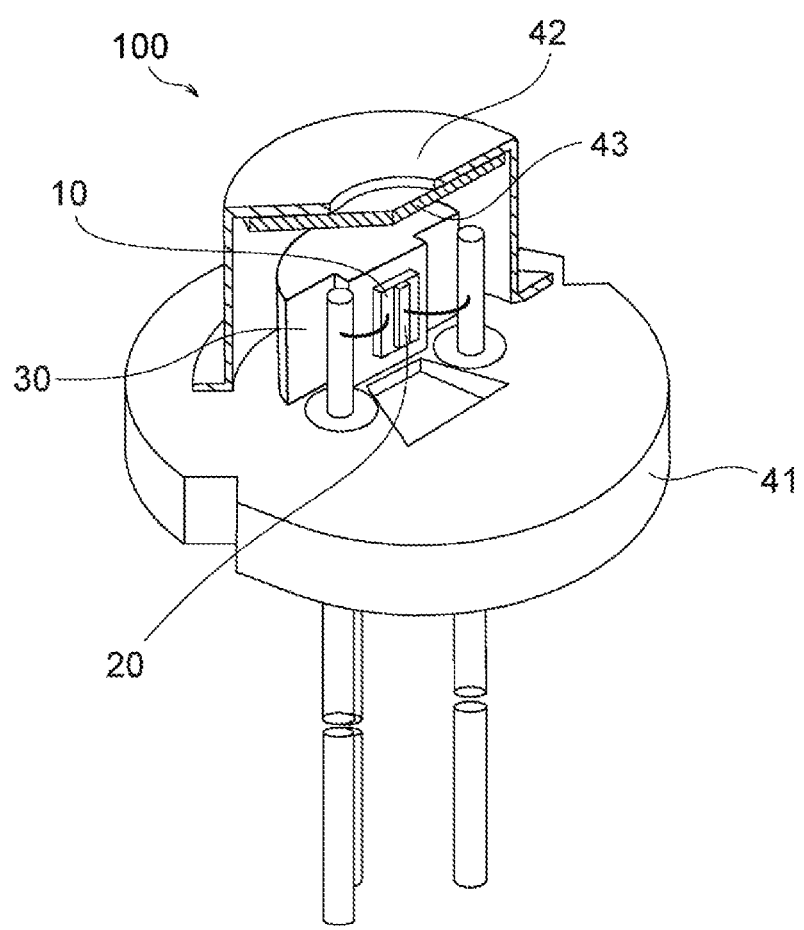
FIG. 1 is a perspective view illustrating an exemplary configuration of a semiconductor laser device according to present embodiments of the present invention.

FIG. 1 is a perspective view illustrating an exemplary configuration of a semiconductor laser device 100 according to a first embodiment of the present invention. The semiconductor laser device 100 is provided with a silicon carbide (hereinafter referred to as "SiC") substrate 10, a semiconductor laser chip (hereinafter referred to as "LD chip") 20, and a heatsink portion (a base portion) 30.

The SiC substrate 10 is a sub-mount substrate made of a monocrystalline or single crystal SiC (hereinafter also referred to as "monocrystalline SiC") having the electrical conductivity, and constitutes a sub-mount onto which a laser diode (hereinafter referred to as "LD") chip 20.

According to the present embodiment throughout the present disclosure, an SiC substrate that contains impurities equal to or greater than $1*10^{14}/cm^3$ is defined as "electric conductive" SiC substrate, whereas an SiC substrate that contains impurities less than $1*10^{14}/cm^3$ is defined as "insulating" SiC substrate. Also, according to the present embodiment, the SiC substrate 10 is referred to as the SiC substrate that contains n-type impurity within the above described range.

The LD chip 20 is, although not shown in the drawings, provided with a semiconductor layer. The semiconductor layer may be configured such that at least a first electric conductive semiconductor layer, an active layer, and a second electric conductive semiconductor layer are in turn layered on the substrate in this order. The above described substrate may be made of any of a GaAs-based material, an InP-based material, and a GaN-based material. The LD chip 20 is supplied with a prescribed injection current and emits laser light having a prescribed oscillation or emission wavelength. In this case, the LD chip 20 may have the rated power output equal to or greater than 1 W. It should be noted that the oscillation wavelength of the laser light is not limited to a specific wavelength.

A sub-mount onto which the LD chip 20 is mounted is joined to the heat sink portion 30. The heatsink portion 30 is arranged in a vicinity of a center portion on a circular surface of a stem 41 having a disc shape. The sub-mount is joined to the heatsink portion 30 such that, for example, an emission direction of the laser light emitted from the LD chip 20 coincides with a direction perpendicular to the circular surface of the stem 41. Also, in this case, the sub-mount may be joined to the heatsink portion 30 such that a light emitting point of the LD chip 20 is positioned in the center of the circular surface of the stem 41.

Yet also, the sub-mount configured to include the SiC substrate 10, the LD chip 20, and the heatsink portion 30 are covered by a cap 42 having a cylindrical shape together with surrounding lead pins or wires or the like. The cap 42 is mounted onto those components with the aim to protect the LD chip 20 or the wires or the like. A light extracting window 43 is provided at an opening formed in the center portion of an upper face of the cap 42. The laser light emitted from the LD chip 20 passes through the light extracting window 43 so as to exit outside the step 41.

The heatsink portion 30 is constituted with a metal material having a high heat dissipation property (for example, Cu or the like). Heat generated from the LD chip 20 when emitting is transferred, through the sub-mount configured to include the SiC substrate 10, to the heatsink portion 30 so as to be dissipated or radiated.

Figure 2:
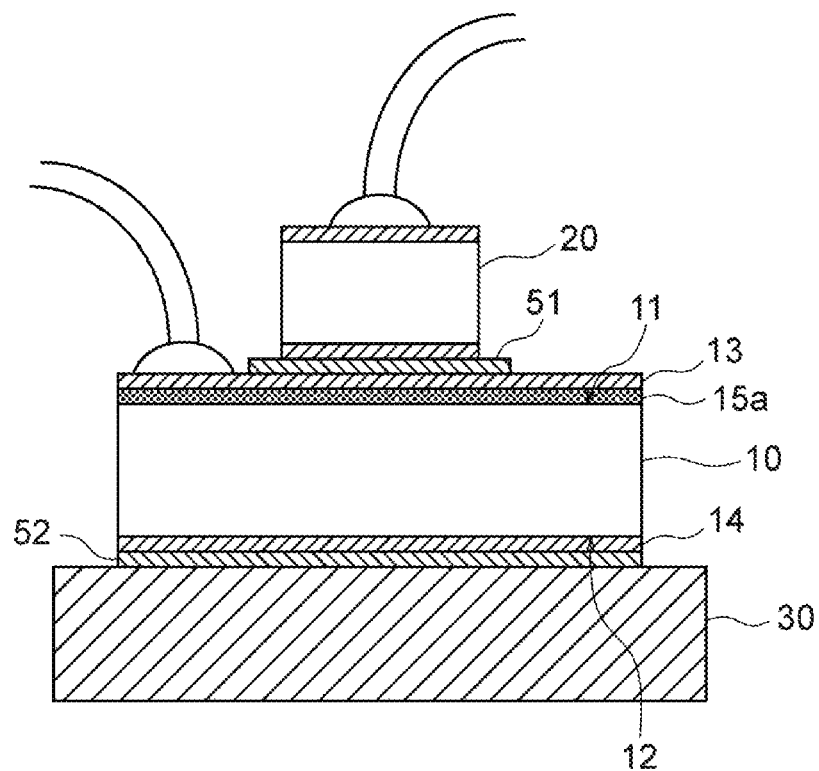
FIG. 2 is a cross sectional view illustrating an exemplary configuration of a sub-mount according to a first embodiment.

FIG. 2 is a cross sectional view illustrating an exemplary configuration of a sub-mount according to the first embodiment. FIG. 2 illustrates a joining portion of the SiC substrate 10, the LD chip 20, and the heatsink portion 30 in an enlarged manner.

SiC substrate 10 includes a first surface 11 and a second surface 12 opposing to the first surface 11. The first surface 11 may be a surface that is, for example, parallel to the c-plane. According to the first embodiment, a certain case will be described in which the first surface 11 and the second surface 12 are arranged to be opposed to each other in the direction perpendicular to the emission direction of the laser light emitted from the LD chip 20. The first surface 11 side of the SiC substrate 10 is provided with a first electric conductive layer 13, and the second surface 12 side of the SiC substrate 10 is provided with a second electric conductive layer 14. In this case, the first electric conductive layer 13 and the second electric conductive layer 14 may be made of one or more materials selected from a group consisting of titanium (Ti), nickel (Ni), platinum (Pt), molybdenum (Mo), and silver or argentum (Au), respectively.

The LD chip 20 is joined onto the first electric conductive layer 13 through a joining layer 51. Likewise, the second electric conductive layer 14 is joined to the heatsink portion 30 through a joining layer 52. Here, the joining layer 51 and the joining layer 52 may be formed with the AuSn solder, respectively.

Also, according to the first embodiment, on the first surface 11 of the SiC substrate 10, an insulating film 15a is provided for preventing the short-circuit between the first electric conductive layer and the second electric conductive layer 14. The insulating film 15a may be made of, for example, one or more materials selected from a group consisting of aluminum nitride, silicon nitride, silicon oxide, aluminum oxide, aluminum oxynitride, titanium oxide, and silicon oxynitride.

It should be noted that, preferably, the insulating film 15a has a linear expansion coefficient between a linear expansion coefficient of the SiC substrate 10 and a linear expansion coefficient of the semiconductor layer of the LD chip 20. For example, when the semiconductor layer of the LD chip 20 is made of gallium arsenide (GaAs), it is preferable to select aluminum nitride (AlN) for the insulating film 15a. The SiC has the linear expansion coefficient of $3.1*10^{-6}$/degrees Celsius, gallium arsenide (GaAs) has the linear expansion coefficient of $5.9*10^{-6}$/degrees Celsius, and aluminum nitride has the linear expansion coefficient of $4.6*10^{-6}$/degrees Celsius.

For example, when the insulating film 15a is made of aluminum nitride (AlN), the aluminum nitride film is preferably monocrystalline or polycrystalline. Also, when the insulating film 15a is made of AlN, the insulating film 15a preferably has the film thickness equal to or greater than 0.2 µm and equal to or less than 10 µm, and more preferably has the film thickness equal to or less than 4 µm. The reason why a lower limit value of the film thickness of the insulating film 15a is set to 0.2 µm is because the dielectric breakdown voltage (insulation withstand voltage) of AlN should be taken into consideration. More particularly, the dielectric breakdown voltage of AlN is 15 V/µm, and in general an operation voltage of the red laser is 2.5 V. For this reason, the film thickness of 0.2 µm, which is assumed to be durable to the operating voltage of 3 V, is set to the lower limit value of the film thickness of the insulating film 15a. On the other hand, the reason why an upper limit value of the film thickness of the isolating film 15a is set to 10 µm is because a possible exfoliation or a crack due to the membrane stress should be taken into consideration.

As described above, according to the semiconductor laser device 100 of the first embodiment, the SiC substrate 10 made of the monocrystalline SiC having the electrical conductivity is employed for the sub-mount substrate. The inventors of the present invention have found out the fact that the monocrystalline SiC substrate having the electrical conductivity contains less micropipes as compared to a monocrystalline SiC substrate having the insulating property. Since the monocrystalline SiC substrate having the electrical conductivity contains less micropipes, such monocrystalline SiC substrate having the electrical conductivity is superior to the monocrystalline SiC substrate having the insulating property from the perspective of the thermal conductivity, in other words, the heat dissipation property. As a result, it makes it possible to obtain the semiconductor laser device 100 onto which the sub-mount is mounted having the higher heat dissipation property.

According to the first embodiment, the number of the micropipes per wafer (in a unit of wafer) of the monocrystalline SiC substrate having the electrical conductivity is equal to or less than 30/cm² or 10/cm², preferably 5/cm², and more preferably 1/cm². After divided for the semiconductor laser chip, within the sub-mount for the semiconductor laser element, it is preferable that the number of the micropipes is substantially zero (zero or approximately zero).

In addition, according to the first embodiment, since the insulating film 15a is arranged on the first surface 11 of the SiC substrate 10, it makes it possible to prevent the short-circuit between the first electric conductive layer 13, which is arranged on a front face of the SiC substrate (that is, a surface at the first surface 11 side), and the second electric conductive layer 14, which is arranged on a rear face thereof (that is, a surface at the second surface 12 side). In other words, although the SiC substrate 10 itself is a electric conductive substrate, it makes it possible to insulate a electric conductive member to be joined to the first surface 11 side of the SiC substrate 10 (that is, the first electric conductive layer 13 and the LD chip 20) from another electric conductive member to be jointed to the second surface 12 side of the SiC substrate 10 (that is, the second electric conductive layer 14 and the heatsink portion 30) in an appropriate manner.

In addition, since the SiC substrate 10 has no micropipes or substantially no micropipes, the insulating film 15a is unlikely to be buried into the micropipes. For this reason, the surface of the insulating film 15a is unlikely to rise and fall (roll) due to the micropipes so as to eliminate the polishing process in order to flatten the surface of the insulating film 15a. As a result, it makes it possible to simplify the manufacturing process of the sub-mount substrate.

As described above, according to the first embodiment, in the monocrystalline SiC substrate having the electrical conductivity, it makes it possible to assure the insulating property while taking an advantage of the higher heat dissipation property and the inexpensiveness. As a result, it makes it possible to obtain the semiconductor laser device 100 utilizing the monocrystalline SiC substrate that is capable of assuring the sufficient heat dissipation property and insulating property.

Yet in addition, as described above, the SiC substrate having the electrical conductivity contains less micropipes as compared to the SiC substrate having the insulating property. When the content of the micropipes is high, for example, during the wet treatment process, treatment liquid is likely to immerse into the micropipes so that a certain defect may be anticipated such as the treatment liquid ejecting therefrom during the heating process thereafter. On the other hand, according to the first embodiment, as the SiC substrate having the electrical conductivity that contains less micropipes is employed, such defect is unlikely to occur so that the workability is stabilized.

Yet in addition, according to the first embodiment, the insulating film 15a is arranged on the first surface 11, which is a surface at the LD chip 20 side of the SiC substrate 10. Accordingly, when joining the SiC substrate 10 to the heatsink portion 30 by the joining layer 52, even if the solder material constituting the joining layer 52 is creeping into a side face of the SiC substrate 10, the short-circuit is unlikely to occur between the first electric conductive layer 13 and the second electric conductive layer 14.

Yet also, when the semiconductor layer constituting the LD chip 20 is made of any of a GaAs-based material, InP-based material, and GaN-based material, the insulating film 15a may be made of one or more materials selected from a group consisting of aluminum nitride, silicon nitride, silicon oxide, aluminum oxide, aluminum oxynitride, titanium oxide, and silicon oxynitride. In this way, by constituting the insulating film 15a with the above described material, it makes it possible to obtain a desirable insulating film 15a that has a linear expansion coefficient between a linear expansion coefficient of the SiC substrate 10 and a linear expansion coefficient of the semiconductor layer of the LD chip 20 while a sufficient insulating property is assured in order to prevent the short-circuit. As a result, it makes is possible to join the LD chip 20 to the heatsink portion 30 in an appropriate manner and also to avoid a possible defect of the semiconductor laser device 100 itself.

Yet in addition, when the insulating film 15a is made of AlN, the insulating film 15a may have the film thickness within the range between 0.2 µm and 10 µm. With the film thickness of the insulating film 15a being so configured, it makes it possible to obtain the insulating film 15a that has the film thickness set to the appropriate range taking both the assurance of the insulating property and the film forming limit into consideration. Also, the insulating film 15a may be made of the monocrystalline AlN film or the polycrystalline AlN film. In this way, as the AlN film is not in the amorphous state but in the crystalline state, it makes it possible to attain a higher thermal conductivity.

Yet in addition, the LD chip 20 may have a rated power output equal to or greater than 1 W. In this way, in the LD chip 20 having a larger power output, higher heat dissipation property is more and more necessitated. For this reason, when the above described SiC substrate according to the first embodiment is employed for the sub-mount substrate, higher benefit can be attained.

Yet in addition, the monocrystalline SiC has different thermal conductivities from one crystalline orientation to another, in other words, the thermal conductivity thereof has the anisotropy (anisotropic property). Utilizing this property thereof, in order to further improve the heat dissipation property of the SiC substrate 10, the thickness direction of the SiC substrate 10 (that is, a vertical direction in FIG. 2) may incline uniformly with respect to the crystal axis or axes of the SiC substrate 10. In the monocrystalline SiC, the thermal conductivity of the a-axis is higher than the thermal conductivity of the c-axis. In other words, the SiC substrate 10 has a crystal structure that includes a first crystalline plane (c-plane) and a second crystalline plane (a-plane). The first crystalline plane (c-plane) has a normal line direction thereof on a first crystalline axis (c-axis), and a second crystalline plane (a-plane) has a normal line direction thereof on a second crystalline axis (a-axis) of which thermal conductivity is higher than the first crystalline axis (c-axis). For this reason, according to the first embodiment, the first crystalline plane (c-plane) may incline with respect to the first surface 11 of the SiC substrate 10.

In the monocrystalline SiC, as described above, the thermal conductivity of the a-axis is higher than the thermal conductivity of the c-axis so that the monocrystalline SiC has a higher heat dissipation property in the a-axis direction than in the c-axis direction. For this reason, by uniformly inclining the c-plane of the SiC substrate 10 with respect to the first surface 11, it makes it possible to add the a-xis direction component having a higher thermal conductivity to the thickness direction of the SiC substrate 10. Thus, it makes it possible to improve the heat dissipation property in the thickness direction of the SiC substrate 10 as compared to the case in which the thickness direction of the SiC substrate 10 coincides with the c-axis direction. As a result, it makes it possible to dissipate or release the heat generated from the LD chip 20 when emitting to the heats ink portion 30 arranged to be opposed to the LD chip 20 in the thickness direction of the SiC substrate 10.

Second Embodiment

Hereinafter a second embodiment of a semiconductor laser device according to the present invention will be described in detail.

In the above described first embodiment, a certain case in which the insulating film 15a is arranged on the first surface 11 has been described. In the second embodiment, a case in which the insulating film is arranged on the second surface 12 will be described.

Figure 3:
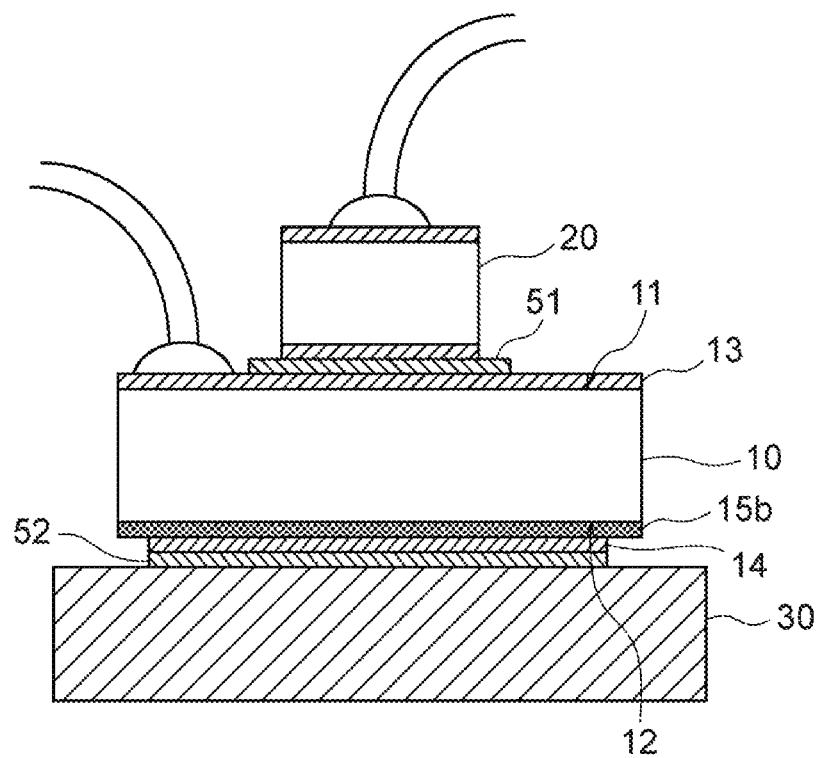
FIG. 3 is a cross sectional view illustrating an exemplary configuration of a sub-mount according to a second embodiment.

FIG. 3 is a cross sectional view illustrating an exemplary configuration of a sub-mount according to the second embodiment. In FIG. 3, a portion having a same or similar structure or component to the first embodiment shown in FIG. 2 is denoted with the same reference sign and different portion therefrom in structure will be mainly described below.

According to the second embodiment, a first electric conductive layer 13 is arranged on the first surface 11 of the SiC substrate 10, and an insulating film 15b is arranged on the second surface 12 of the SiC substrate 10. The insulating film 15b is arranged on an entire face of the second surface 12 of the SiC substrate 10. Also, the second electric conductive layer 14 is arranged on the insulating film 15b. In this case, the second electric conductive layer 14 may be, as shown in FIG. 3, arranged on a partial region of the insulating film 15b.

According to the second embodiment, the insulating film 15b arranged on the second surface 12 prevents the short-circuit between the first electric conductive layer 13 and the second electric conductive layer 14. In this case, the insulating film 15b has a configuration similar to those of the above described insulating film 15a.

As described above, according to the second embodiment, by providing the insulating film 15b arranged on the second surface 12 of the SiC substrate 10, it makes it possible to prevent the leakage of the heatsink portion 30 and the LD chip 20. As a result, similarly to the above described first embodiment, it makes it possible to obtain a semiconductor laser device 100 utilizing the monocrystalline SiC substrate that is capable of assuring both the sufficient heat dissipation property and insulating property.

In addition, according to the second embodiment, since the insulating film 15b is arranged on the second surface 12 of the SiC substrate 10, which is close to or in the vicinity of the heatsink portion 30, it makes it possible to further improve the heat dissipation property. The insulating film (AlN) 15b has the lower thermal conductivity than the SiC substrate 10. For this reason, by arranging the insulating film 15b on the second surface 12, which is distant from the LD chip 20 serving as the heat generating portion, it makes it possible to further improve the heat dissipation property of the sub-mount as a whole. In other words, according to the second embodiment, by devising the arrangement of the insulating film 15b, which has a lower thermal conductivity, it makes it possible to avoid impairing the primary purpose for selecting the monocrystalline SiC substrate in order to improve the heat dissipation property.

Yet in addition, the insulating film 15b has the same area as an area of the second surface 12 of the SiC substrate 10, which is larger than an area of the second electric conductive layer 14. In other words, the joining layer 52 is arranged such that the joining layer 52 gets into an inner side of the edge portion of the insulating film 15b. With the joining layer 52 being so configured, it makes it possible to make the distance longer from the edge portion of the joining layer 52 to the side face of the SiC substrate 10. As a result, when the sub-mount onto which the LD chip 20 is mounted is joined to the heatsink portion 30, it makes it possible to prevent the molten or melted joining material (in particular, the solder) from adhering to the side face of the SiC substrate 10 so as to prevent the dielectric breakdown from occurring.

Modification to Second Embodiment

Figure 4:
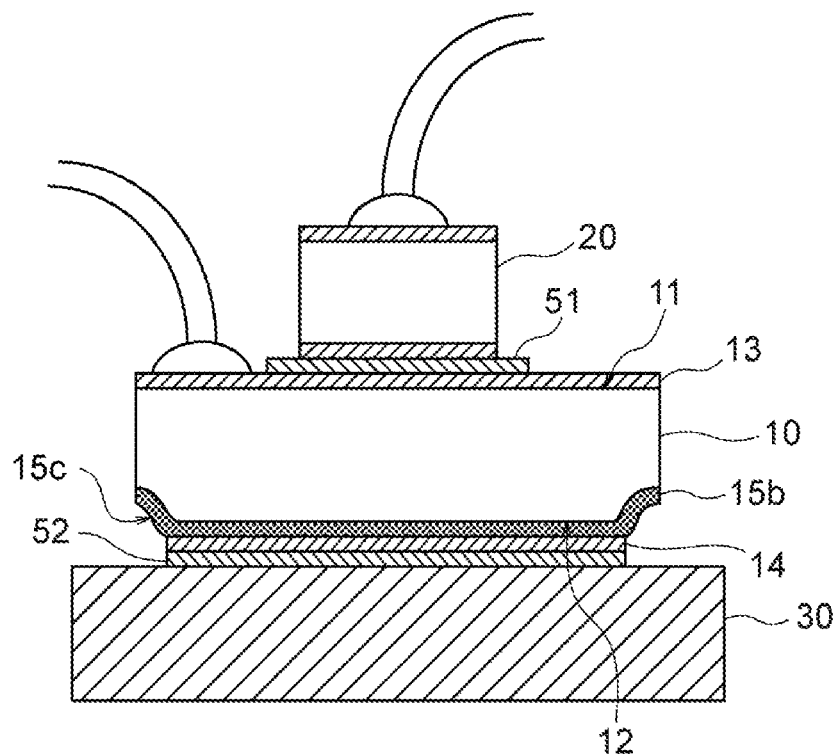
FIG. 4 is a cross sectional view illustrating an exemplary configuration of a sub-mount according to a modification to the second embodiment.

In the above described second embodiment, when the sub-mount onto which the LD chip 20 is mounted is joined to the heatsink portion 30, the SiC substrate 10 and the insulating film 15b may be formed in the shapes shown in FIG. 4, respectively, in order to prevent the molten joining material from adhering to the side face of the SiC substrate 10 in more assured manner. In other words, an edge portion at the second surface 12 side of the SiC substrate 10 may be scraped in a sloped shape, and a bent portion 15c may be formed at the edge portion of the insulating film 15b.

By forming the SiC substrate 10 and the insulating film 15b in such a shape, it makes it possible to further make the distance longer from the joining material to the side face of the SiC Substrate so as to prevent the joining material from adhering to the side face of the SiC substrate 10 in more assured manner.

Third Embodiment

Hereinafter a third embodiment of a semiconductor laser device according to the present invention will be described in detail.

In the above described first embodiment and second embodiment, a certain case in which the insulating film is arranged on either the first surface 11 or the second surface 12 has been described. In the third embodiment, a case in which insulating films are arranged on the first surface 11 and the second surface 12, respectively, will be described.

Figure 5:
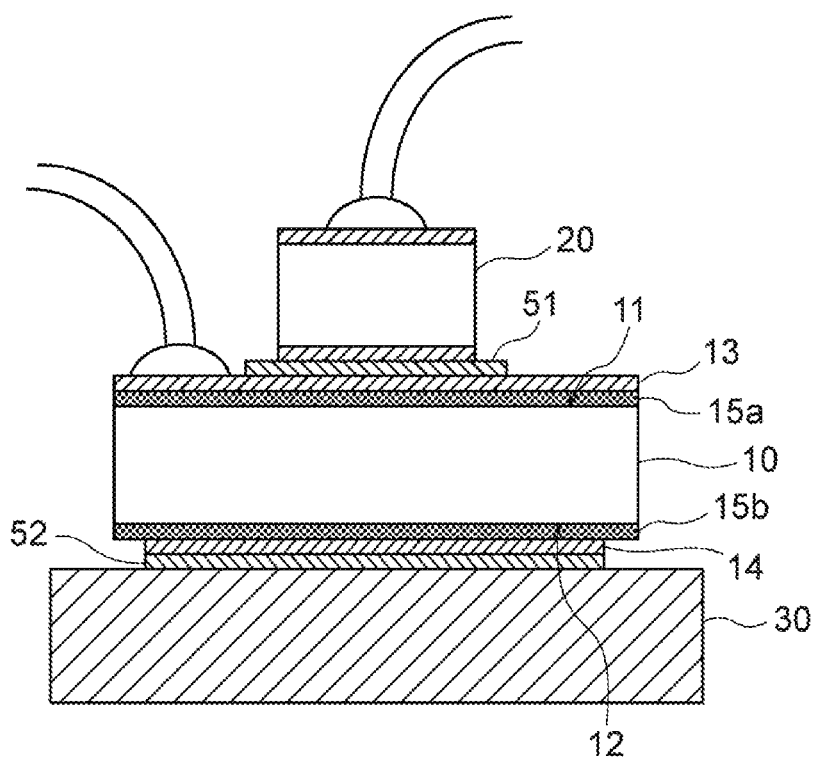
FIG. 5 is a cross sectional view illustrating an exemplary configuration of a sub-mount according to a third embodiment.

FIG. 5 is a cross sectional view illustrating an exemplary configuration of a sub-mount according to the third embodiment. In FIG. 5, same or similar structure or component to the first embodiment shown in FIG. 2 or the second embodiment shown in FIG. 3 is denoted with the same reference sign and different portion therefrom in structure will be mainly described below.

According to the third embodiment, the insulating film 15a is arranged on the first surface 11 of the SiC substrate 10, and the insulating film 15b is arranged on the second surface 12 of the SiC substrate 10. Those insulating films 15a and 15b prevent the short-circuit between the first electric conductive layer and the second electric conductive layer 14.

In this way, by forming the insulating films on both of an upper and lower faces of the SiC substrate 10, it makes it possible to sufficiently assure the total film thickness of the insulating films so as to further assure the insulating property of the SiC substrate 10.

It should be noted that, also in this case, the edge portion at the second surface 12 side of the SiC substrate 10 may be scraped in the sloped shape as shown in FIG. 4 and the bent portion 15c may be formed at the edge portion of the insulating film 15b in order to prevent the joining material from adhering to the side face of the SiC substrate 10 in an assured manner.

Fourth Embodiment

Hereinafter a fourth embodiment of a semiconductor laser device according to the present invention will be described in detail.

In the above described first embodiment to third embodiment, a certain case in which the first surface 11 and the second surface 12 are arranged to be opposed to each other has been described. In the fourth embodiment, a case in which the first surface 11 and the second surface 12 are arranged not to be opposed to each other will be described.

FIG. 6 is a cross sectional view illustrating an exemplary configuration of a sub-mount according to the fourth embodiment. In FIG. 6, same or similar structure or component to the first embodiment shown in FIG. 2 is denoted with the same reference sign and different portion therefrom in structure will be mainly described below.

As shown in FIG. 6, a second surface 12' of the SiC substrate 10 is set to a plane perpendicular to the first surface 11. According to the fourth embodiment, the second surface 12' of the SiC substrate 10 is joined to the heatsink portion 30 through the joining layer 53. In this case, the joining layer 53 may be made of silver (Ag) paste. According to the fourth embodiment, similarly to the above described first embodiment, the insulating film 15a is arranged on the first surface 11 of the SiC substrate 10.

In this case, the insulating film 15a prevents the short-circuit between the first electric conductive layer 13 and the heatsink portion 30. In other words, the insulating film 15a insulates the first electric conductive layer 13 from the electric conductive member to be joined to the second surface 12' of the SiC substrate 10. As a result, similarly to those embodiments described above, it makes it possible to obtain a semiconductor laser device 100 utilizing the monocrystalline SiC substrate that is capable of assuring both the sufficient heat dissipation property and insulating property.

It should be noted that, although referring to FIG. 6 a certain case in which the insulating film 15a is arranged on the first surface 11 of the SiC substrate 10 has been described, alternatively, an insulating film similar to the insulating film 15a may be arranged on the second surface 12' of the SiC substrate 10, or insulating films may be arranged on both the first surface 11 and the second surface 12', respectively.

Modifications to Embodiments

Although in the above described embodiments a certain case of the semiconductor laser device 100 of a can (that is, canned package) type, a semiconductor laser device to which the present invention can be applied is not limited to those of can type.

Furthermore, although in the above described embodiments a certain case in which the LD chip 20 is a vertical type LD chip having an n-side electrode arranged on one face of the substrate and a p-side electrode arranged on the other face thereof, alternatively, the LD chip 20 may be a lateral type LD chip having the n-side electrode and the p-type electrode both arranged on the same face of the substrate. In this case, it is not necessarily required for the electric conductive layer 13 to be formed on the first surface 11 of the SiC substrate 10, and the insulating films 15a and 15b may be eliminated. In other words, the semiconductor laser device may be configured to be provided with a monocrystalline SiC substrate 10 having the electrical conductivity, and the lateral type LD chip arranged on the first surface 11 of the SiC substrate 10.

While certain embodiments have been described, these embodiments have been presented by way of example only, and are not intended to limit the scope of the present invention. The novel devices, apparatuses and methods thereof described herein may be embodied in a variety of other forms. Furthermore, various omissions, substitutions, modifications and changes in the form of the devices, apparatuses and methods thereof described herein may be made without departing from the gist of the present invention. The accompanying claims and their equivalents are intended to cover such forms of modifications as would fall within the scope and gist of the present invention.

The present application is based upon and claims the benefit of a priority from Japanese Patent Application No. 2017-61058, filed on Mar. 27, 2017 and Japanese Patent Application No. 2017-164095, filed on Aug. 29, 2017, and the entire content of those Japanese Patent Applications is incorporated herein by reference.

REFERENCE SIGNS LIST

100: Semiconductor Laser Device
10: Silicon Carbide (SiC) Substrate
11: First Surface
12: Second Surface
12': Second Surface
13: First Electric Conductive Layer
14: Second Electric Conductive Layer
15a; 15b: Insulating Film
15c: Bent Portion
20: Semiconductor Laser Chip (LD Chip)
30: Heatsink Portion
51; 52; 53: Joining Layer

What is claimed is:

1. A semiconductor laser device, comprising:
a monocrystalline silicon carbide (SiC) substrate that is electrically conductive, the SiC substrate being provided with a first surface and a second surface; and
a semiconductor laser chip arranged on the first surface of the SiC substrate, wherein
the SiC substrate contains impurities equal to or greater than $1\times10^{14}/cm^3$,
the SiC substrate contains less micropipes per a same unit of area than a monocrystalline SiC substrate that is not electrically conductive,
the SiC substrate further comprises:
a first electric conductive layer provided on the first surface of the SiC substrate;
a first joining layer made of AuSn and configured to join the first electric conductive layer to the semiconductor laser chip;
a second electric conductive layer provided on the second surface of the SiC substrate;
a second joining layer made of AuSn and configured to join the second electric conductive layer to a heatsink; and
an insulating film having a thickness less than 10 µm and configured to insulate the semiconductor laser chip from the heatsink,
the insulating film is formed on at least one of the first surface or the second surface of the SiC substrate along a direction of either the first surface or the second surface, and
the insulating film has a linear expansion coefficient between linear expansion coefficients of the SiC substrate and a semiconductor layer constituting the semiconductor laser chip.

2. The semiconductor laser device according to claim 1, wherein
the insulating film insulates the first electric conductive layer from the second electric conductive layer.

3. The semiconductor laser device according to claim 1, wherein the insulating film is arranged on the first surface.

4. The semiconductor laser device according to claim 1, wherein the insulating film is arranged on the second surface.

5. The semiconductor laser device according to claim 1, wherein the insulating film has a film thickness equal to or greater than 0.2 µm and equal to or less than 10 µm.

6. The semiconductor laser device according to claim 5, wherein the insulating film has the film thickness equal to or less than 0.4 µm.

7. The semiconductor laser device according to claim 1, wherein
the semiconductor layer constituting the semiconductor laser chip includes a material made of any of GaAs-based material, InP-based material, and GaN-based material, and
the insulating film is made of one or more materials selected from a group consisting of aluminum nitride, silicon nitride, silicon oxide, aluminum oxide, aluminum oxynitride, titanium nitride, and silicon oxynitride.

8. The semiconductor laser device according to claim 1, wherein
the insulating film is any one of a monocrystalline aluminum nitride film and a polycrystalline aluminum nitride film.

9. The semiconductor laser device according to claim 1, wherein
the SiC substrate has a crystalline structure including a first crystalline plane and a second crystalline plane, the first crystalline plane having a normal line direction thereof on a first crystalline axis and the second crystalline plane having a normal line direction thereof on a second crystalline axis having a higher heat conductivity than the first crystalline axis, and
the first crystalline plane inclines with respect to the first surface of the SiC substrate.

10. The semiconductor laser device according to claim 1, wherein
the semiconductor laser chip has a rated power output equal to or greater than 1 W.

11. The semiconductor laser device according to claim 1, wherein
a number of micropipes per wafer of the monocrystalline SiC substrate having the electrical conductivity is equal to or less than $30/cm^2$.

* * * * *